United States Patent
Wan et al.

(10) Patent No.: US 9,349,765 B2
(45) Date of Patent: May 24, 2016

(54) SUSPENDED LENS SYSTEM HAVING A NON-ZERO OPTICAL TRANSMISSION SUBSTRATE FACING THE CONCAVE SURFACE OF A SINGLE-PIECE LENS AND WAFER-LEVEL METHOD FOR MANUFACTURING THE SAME

(71) Applicant: OmniVision Technologies, Inc., Santa Clara, CA (US)

(72) Inventors: Tsung Wei Wan, Baoshan Township (TW); Wei-Ping Chen, New Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 99 days.

(21) Appl. No.: 14/276,527

(22) Filed: May 13, 2014

(65) Prior Publication Data

US 2015/0333094 A1    Nov. 19, 2015

(51) Int. Cl.
| | |
|---|---|
| *G02B 13/00* | (2006.01) |
| *H01L 27/146* | (2006.01) |
| *G02B 7/02* | (2006.01) |
| *B32B 38/00* | (2006.01) |

(52) U.S. Cl.
CPC ...... *H01L 27/14627* (2013.01); *B32B 38/0004* (2013.01); *G02B 7/02* (2013.01); *G02B 7/021* (2013.01); *G02B 13/0085* (2013.01); *H01L 27/14632* (2013.01)

(58) Field of Classification Search
CPC .................. H01L 2933/005; H01L 2933/0058; H01L 31/048; G02B 27/2214; G02B 13/0045
USPC ............... 250/208.1, 239, 216; 359/443–455, 359/507–511, 708–716
See application file for complete search history.

(56) References Cited

U.S. PATENT DOCUMENTS 6,507,443 B2 *    1/2003   Kitagawa ................. G02B 3/02
                                                                      359/708

\* cited by examiner

*Primary Examiner* — Que T Le
(74) *Attorney, Agent, or Firm* — Lathrop & Gage LLP

(57) ABSTRACT

A suspended lens system, for imaging a scene, includes (a) a single-piece lens for receiving light from the scene, wherein the single-piece lens includes a concave surface, and (b) a substrate including a side that faces the concave surface, for holding the single-piece lens, wherein the substrate has non-zero optical transmission and contacts only portions of the single-piece lens that are away from the concave surface. A wafer-level method for manufacturing a suspended lens system includes molding a lens array, wherein each lens of the lens array includes a concave surface, and bonding the lens array to a surface of a substrate that has non-zero optical transmission, such that the concave surfaces face the substrate, to form a suspended lens wafer.

23 Claims, 12 Drawing Sheets

SUSPENDED LENS SYSTEM HAVING A NON-ZERO OPTICAL TRANSMISSION SUBSTRATE FACING THE CONCAVE SURFACE OF A SINGLE-PIECE LENS AND WAFER-LEVEL METHOD FOR MANUFACTURING THE SAME

BACKGROUND

The demand for compact camera systems delivering high performance is increasing with the growing use of imaging systems in a wide variety of applications. Such applications are found in areas such as consumer electronics, machine vision, automotive, and medical diagnostics. The performance requirements depend on the particular application. In some applications, such as surveillance and automotive safety, a large field of view is required. Other applications, such as portable consumer devices, may require high quality imaging together with very compact form factor and low cost.

Driven by this demand, camera manufacturers are developing wafer-level cameras using manufacturing technology from the semiconductor industry. Wafer-level cameras are cameras in which the individual parts are manufactured at the wafer-level. Lens wafers and image sensor wafers are diced to singulate individual lenses and individual image sensors, which are subsequently bonded to produce individual wafer-level cameras. Wafer-level technology facilitates the manufacture of compact camera systems at low cost.

SUMMARY

In an embodiment, a suspended lens system, for imaging a scene, includes (a) a first single-piece lens for receiving light from the scene, wherein the first single-piece lens includes a first concave surface, and (b) a substrate including a first side that faces the first concave surface, for holding the first single-piece lens, wherein the substrate has non-zero optical transmission and contacts only portions of the first single-piece lens that are away from the first concave surface.

In an embodiment, a wafer-level method for manufacturing a suspended lens system includes molding a first lens array, wherein each lens of the first lens array includes a concave surface, and bonding the first lens array to a first surface of a substrate that has non-zero optical transmission, such that the concave surfaces face the substrate, to form a suspended lens wafer.

DETAILED DESCRIPTION OF THE EMBODIMENTS

Figure 1:
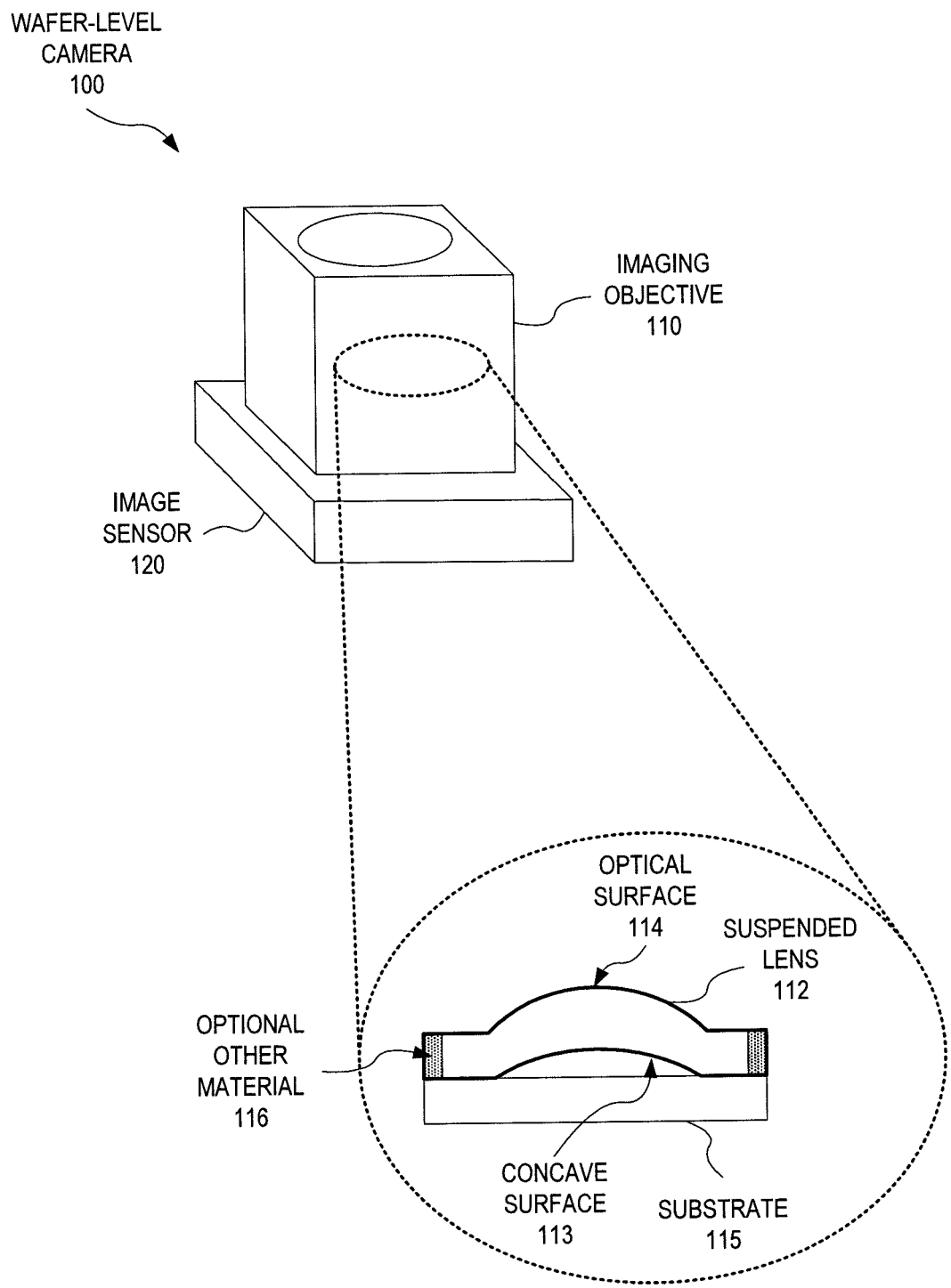
FIG. 1 illustrates a wafer-level camera having an imaging objective that includes a suspended lens, according to an embodiment.

FIG. 1 illustrates one exemplary wafer-level camera 100. Wafer-level camera 100 includes an imaging objective 110 for imaging a scene onto an image sensor 120. Imaging objective 110 includes one exemplary suspended lens 112, which is held by a substrate 115. Substrate 115 has non-zero optical transmission. In an embodiment, substrate 115 includes a material having non-zero optical transmission for passing through light to or from suspended lens 112. In another embodiment, substrate 115 includes apertures for passing through light to or from suspended lens 112. Suspended lens 112 includes a concave surface 113 facing substrate 115. Concave surface 113 curves away from substrate 115. Hence, suspended lens 112 is suspended from substrate 115. Suspended lens 112 includes a second optical surface 114, facing away from substrate 115, for passing through light propagating towards or from concave surface 113 or an operative portion thereof. The operative portion of concave surface 113 is the portion of concave surface 113 that is associated with passage of light traveling from a scene to image sensor 120. Although illustrated in FIG. 1 as being convex, optical surface 114 may be concave, convex, planar, or a combination thereof. In an embodiment, substrate 115 is substantially planar and contacts only substantially planar portions of suspended lens 112. In an embodiment, the surface of substrate 115 facing suspended lens 112 is substantially planar and contacts only substantially planar portions of suspended lens 112.

Suspended lens 112 is a single-piece lens. The term "single-piece lens" refers to a lens, wherein the portion of the lens lying between the optical surfaces is composed of a single piece, made of a single material, with no intervening material, substrate, or medium. Thus, the portion of suspended lens 112 lying between concave surface 113 and optical surface 114 is composed of a single piece with no intervening material, substrate, or medium. Suspended lens 112 may be formed in a single molding step. In an embodiment, suspended lens 112 includes other material 116 located away from the region between concave surface 113 and optical surface 114. Other material 116 may form at least a portion of a spacer material. The embodiment of suspended lens 112 that includes other material 116 also does not have an intervening material, substrate, or medium between concave surface 113 and optical surface 114, and is therefore a single-piece lens. This embodiment of suspended lens 112 may also be formed in a single molding step.

For the purpose of the present disclosure, a wafer-level camera, imaging system, or imaging objective is a camera, imaging system, or imaging objective, respectively, produced using wafer-level manufacturing methods.

Suspended lens 112 is manufactured according to a wafer-level manufacturing method, wherein concave surface 113 and optical surface 114 are molded in a single molding step. This represents a simplification over conventional wafer-level manufacturing methods, which require more steps, and frequently also more material, to manufacture a lens having two non-flat surfaces. Thus imaging objective 110 may be produced at lower cost than conventional wafer-level imaging objectives. Certain embodiments of suspended lens 112 have smaller diameter and/or shorter total height (measured along the optical axis of suspended lens 112) than similar lenses manufactured according to conventional wafer-level methods for lens manufacture. Thus, corresponding embodiments of imaging objective 110 may be made smaller than conventional wafer-level imaging objectives having similar imaging properties. Consequently, wafer-level camera 100 may be made smaller than conventional wafer-level cameras having similar performance. Additionally, the wafer-level methods used to manufacture suspended lens 112 allow for manufacture of embodiments of suspended lens 112 having shorter effective focal length than similar lenses manufactured using conventional wafer-level methods. Such embodiments of suspended lens 112 may in turn result in camera 100 having a greater field of view, as compared to conventional wafer-level cameras.

Figure 2:
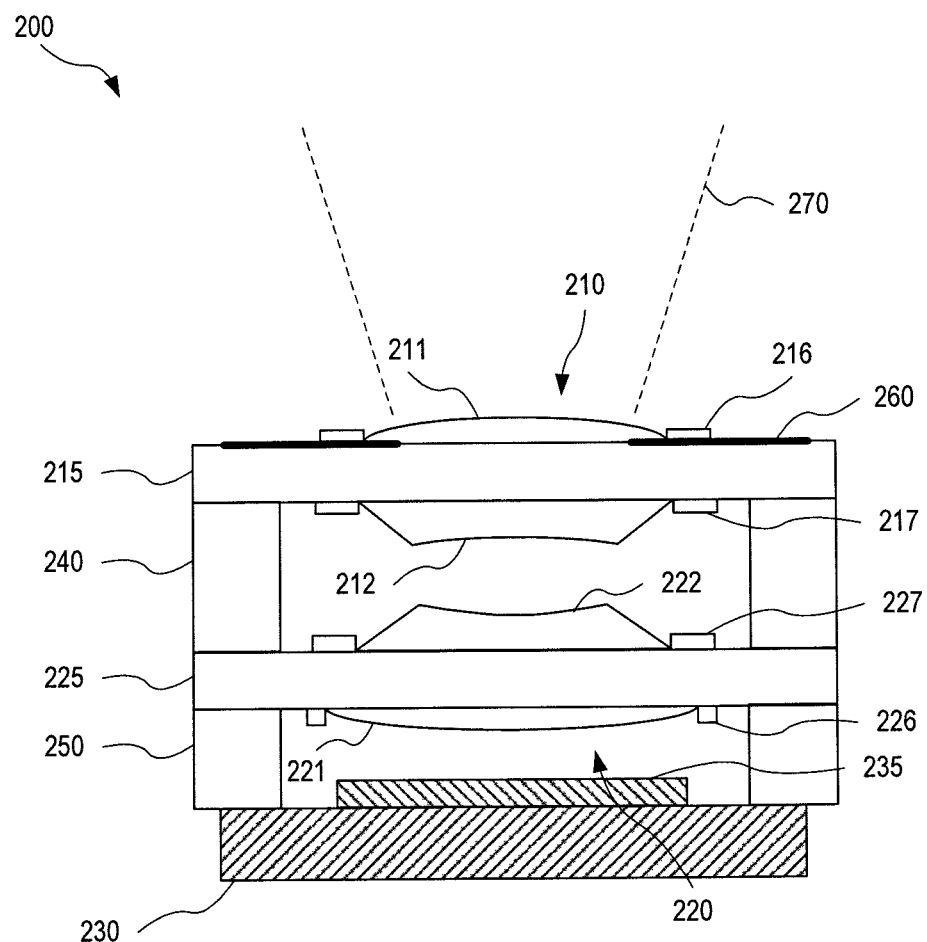
FIG. 2 illustrates a prior-art imaging system manufactured using conventional wafer-level manufacturing methods.
Figure 3:
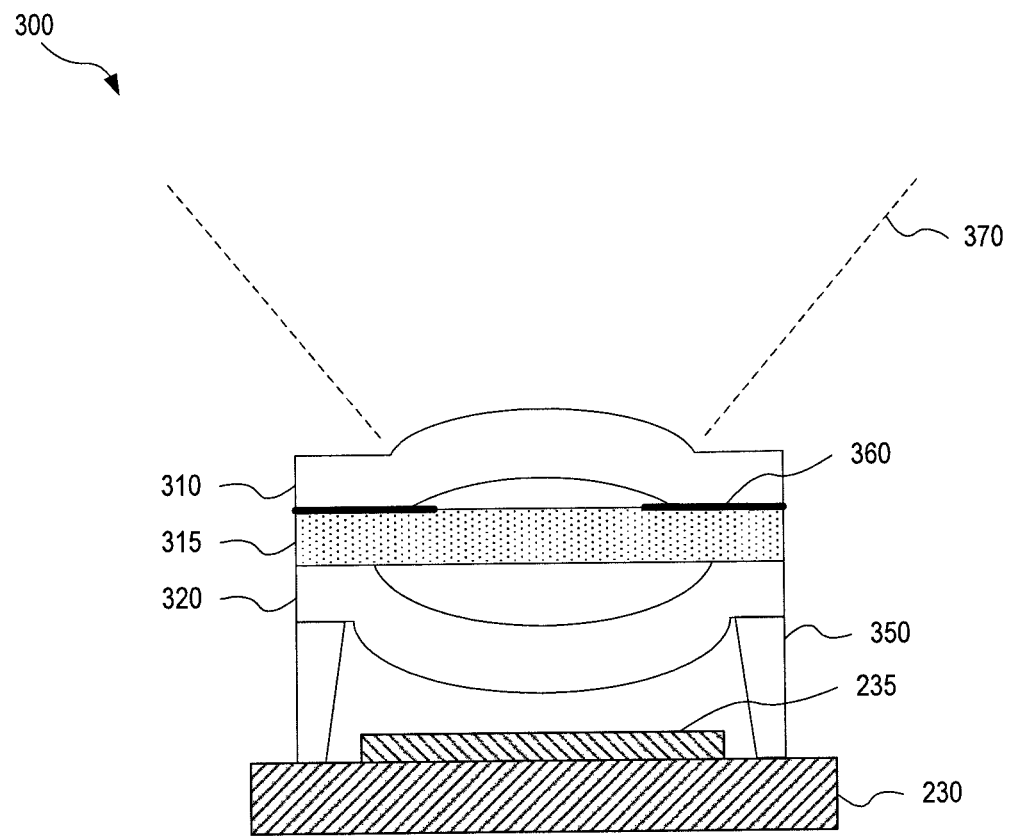
FIG. 3 illustrates a wafer-level imaging system with a suspended-lens imaging objective, according to an embodiment.

FIGS. 2 and 3, discussed below, provide a comparison of one exemplary embodiment of wafer-level camera 100 with a prior art wafer-level camera that is manufactured using conventional wafer-level lens manufacturing methods.

FIG. 2 illustrates a prior-art imaging system 200 manufactured using conventional wafer-level manufacturing methods. Imaging system 200 includes meniscus lenses 210 and 220 for imaging a scene onto a pixel array 235 of an image sensor 230. Meniscus lens 210 includes lens element 211 and 212, which are molded onto two opposing surfaces of a substrate 215. Substrate 215 includes a stop aperture 260. Similarly, meniscus lens 220 includes lens elements 221 and 222, which are molded onto two opposing surfaces of a substrate 225. Substrates 215 and 225 are separated by a spacer 240, while image sensor 230 is mounted onto substrate 225 using a spacer 250. Imaging system 200 has a field of view angle 270.

Each of meniscus lenses 210 and 220 are manufactured at the wafer-level as described in the following for lens 210. A plurality of lens elements 211 are molded on one surface of a common substrate. Substrate 215 is a portion of this common substrate. The molding operation includes placing ultra violet (UV) curable polymer resin on one surface of the common substrate, pressing a suitably shaped stamp against the surface to shape lens elements 211, curing the polymer resin using UV light, and removing the stamp. In order to ensure the desired profile of lens elements 211, the stamp has recesses that serve as buffer areas for taking up excess polymer resin. As a result thereof, each lens element 211 includes microstructure 216 located outside the clear aperture of lens element 211. After molding the plurality of lens elements 211, the substrate is turned upside down. The same method used to mold the plurality of lens elements 211 is applied to the opposite surface of the common substrate to mold a corresponding plurality of lens elements 212. Accordingly, the manufacture of meniscus lens 210 requires two separate molding operations applied to two respective and opposing surfaces of a substrate.

In order to achieve accurate separation distance between meniscus lens 210 and meniscus lens 220, spacer 240 is placed further away from the optical axis of meniscus lenses 210 and 200 than microstructure 217 of lens element 212 and microstructure 227 of lens element 222, respectively. Likewise, spacer 250 is placed further away from the optical axis of meniscus lens 220 than microstructure 226 of lens element 221. As a result, the outer dimensions of spacers 240 and 250, in directions orthogonal to the optical axis of meniscus lenses 210 and 220, exceed the corresponding dimensions of image sensor 230.

The portion of substrate 215 included in meniscus lens 210 imposes a minimum thickness to meniscus lens 210. Substrate 215 effectively pushes apart the convex surface of lens element 211 and the concave surface of lens element 212, which in turn imposes a lower limit to the effective focal length of meniscus lens 210. Thus, the inclusion of substrates 215 and 225 in meniscus lenses 210 and 220, respectively, imposes an upper limit on field of view angle 270, as well as a lower limit on the total height of imaging system 200 in the dimension parallel to the optical axis of meniscus lenses 210 and 220.

FIG. 3 illustrates one exemplary wafer-level imaging system 300 with a suspended-lens imaging objective. Imaging system 300 is an embodiment of camera 100 (FIG. 1). Imaging system 300 includes suspended meniscus lenses 310 and 320, a substrate 315, having non-zero optical transmission, and imaging sensor 230 (FIG. 2). Suspended meniscus lenses 310 and 320 cooperate to image a scene onto pixel array 235 (FIG. 2) of image sensor 230. Suspended meniscus lens 310 is suspended from a surface of substrate 315 facing away from image sensor 230, while suspended meniscus lens 320 is suspended from a surface of substrate 315 facing image sensor 230. Imaging system 300 further includes a spacer 350 for mounting image sensor 230 to suspended meniscus lens 320. Imaging system 370 has a field of view angle 370. Substrate 315 includes a stop aperture 360. Substrate 315 is an embodiment of substrate 115 (FIG. 1), and each of suspended meniscus lenses 310 and 320 is an embodiment of suspended lens 112 (FIG. 1). Together, suspended meniscus lens 310, substrate 315, and suspended meniscus lens 320 form an embodiment of imaging objective 110 (FIG. 1).

Each of suspended meniscus lenses 310 and 320 is a single-piece lens, such that there is no intervening material, substrate, or medium between the concave and convex surfaces. Each of suspended meniscus lenses 310 and 320 is molded in a single molding step and subsequently bonded to substrate 315. Neither of suspended meniscus lenses 310 and 320 includes an internal substrate, such as substrate 215 of prior art imaging system 200 (FIG. 2). Hence, for both of suspended meniscus lenses 310 and 320, the distance between the concave and convex surfaces thereof is smaller than the distance between the curved surfaces of lens elements 211 and 212, or lens elements 221 and 222, of prior art imaging system 200 (FIG. 2). Accordingly, suspended meniscus lenses 310 and 320 have shorter effective focal length than lenses 210 and 220 of prior art imaging system 200 (FIG. 2). As a result, field of view angle 370 is greater than field of view angle 270 associated with prior art imaging system 200 (FIG. 2).

Suspended meniscus lenses 310 and 320 do not have microstructure associated with excess resin, as is the case for lens elements 211, 212, 221, and 222 of prior art imaging system 200 (FIG. 2). Therefore, spacer 350 contacts suspended meniscus lens 320 closer to the optical axis of imaging system 300, as compared to spacers 240 and 250 of prior art imaging system 200 (FIG. 2). Consequently, the outer dimensions of the imaging objective (including suspended meniscus lenses 310 and 320, substrate 315) and the outer dimensions of spacer 350, in directions orthogonal to the optical axis of imaging system 300, are smaller than the corresponding dimensions of image sensor 230.

Figure 4:
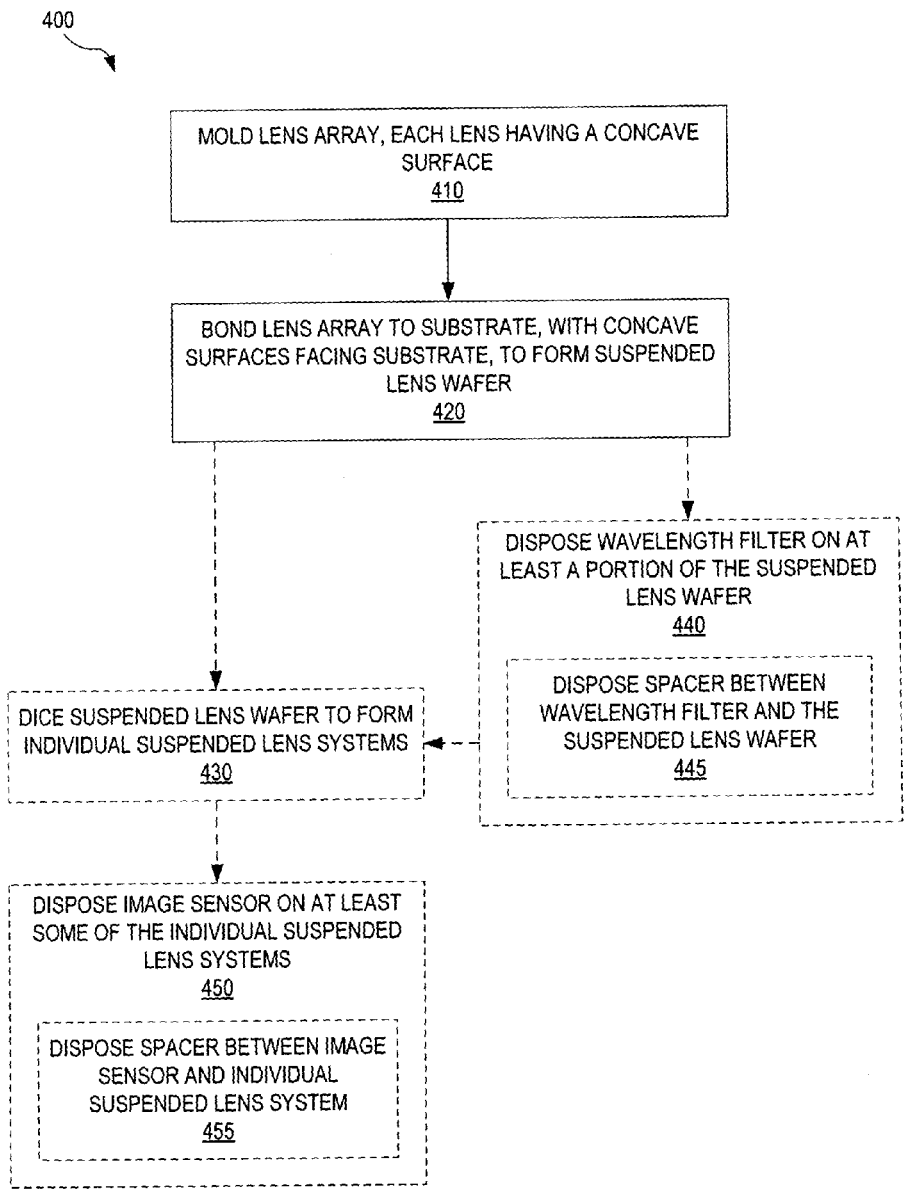
FIG. 4 is a flow chart that illustrates a wafer-level method for manufacturing a suspended lens system, according to an embodiment.
Figure 5:
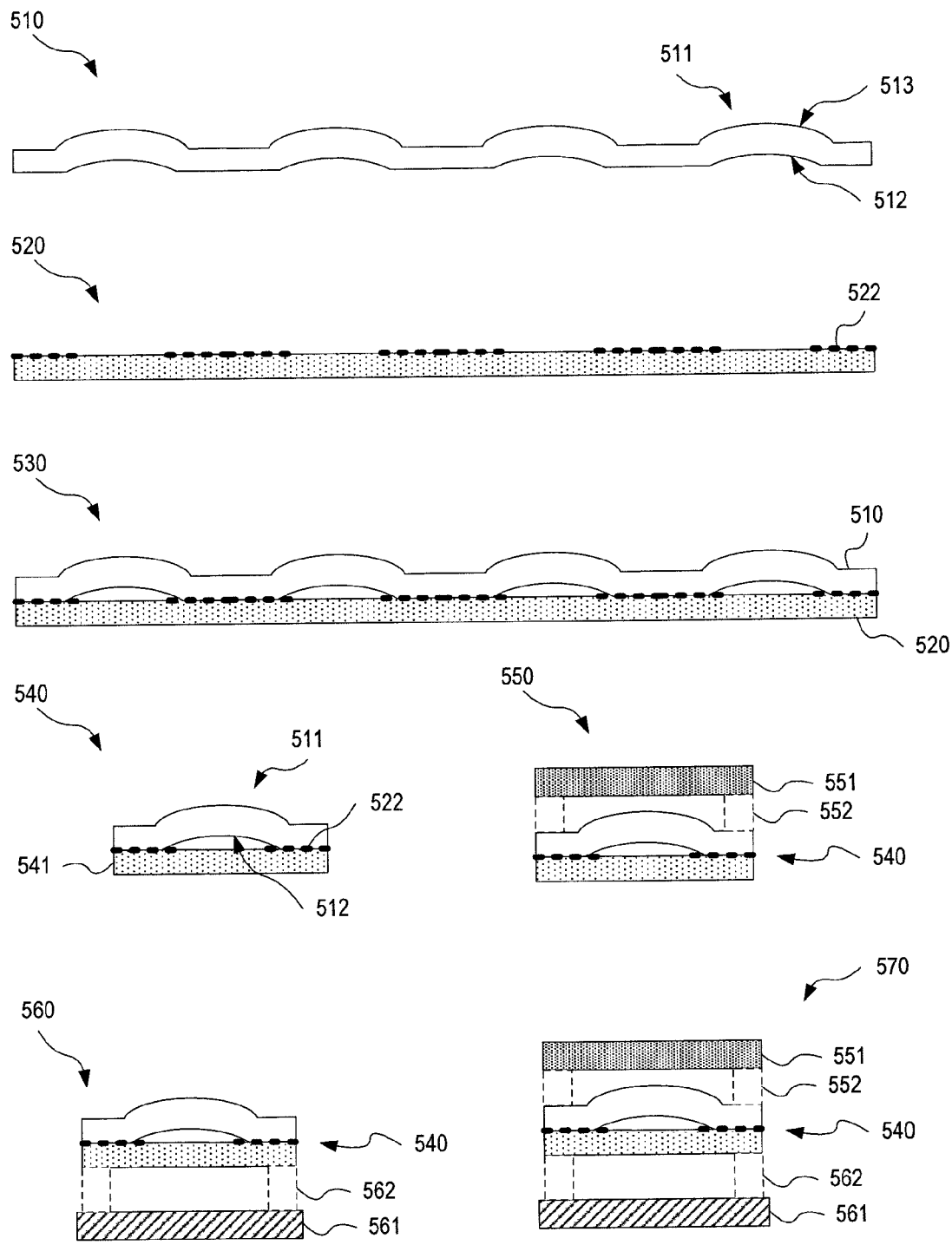
FIG. 5 illustrates a lens array, a substrate, a suspended lens wafer, suspended lens systems, and imaging systems including suspended lens systems, all of which may be formed by or used in the method of FIG. 4, according to an embodiment.

FIG. 4 is a flowchart for one exemplary wafer-level method 400 for manufacturing a suspended lens system. FIG. 5 schematically illustrates, in cross-sectional side view, one exemplary lens array 510, one exemplary substrate 520, one exemplary suspended lens wafer 530, one exemplary suspended lens system 540, one exemplary suspended lens system 550 including suspended lens system 540 and a wavelength filter, one exemplary imaging system 560 including suspended lens system 540 and an image sensor, and one exemplary imaging system 570 including suspended lens system 560 and a wavelength filter. FIG. 5 is not drawn to scale. FIGS. 4 and 5 are best viewed together. Wafer-level method 400 may be used, for example, to manufacture suspended lens system 540, suspended lens system 550, imaging system 560, imaging system 570, or camera 100 of FIG. 1. Suspended lens systems 540 and 550 are embodiments of imaging objective 110 (FIG. 1), and imaging systems 560 and 570 are embodiments of camera 100 (FIG. 1).

In a step 410 (FIG. 4), a lens array 510 is molded. Each lens 511 of lens array 510 is a single-piece lens that includes a concave surface 512 and an optical surface 513. Lens 511 is an embodiment of suspended lens 112 (FIG. 1). Concave surface 512 and optical surface 513 are embodiments of concave surface 113 (FIG. 1) and optical surface 114 (FIG. 1), respectively. For clarity of illustration, not all lenses 511, concave surfaces 512, and optical surfaces 513 are labeled in FIG. 5. Although illustrated as meniscus lenses in FIG. 5, lenses 511 may have other shapes. For example, optical surface 513 may be convex, concave, planar, or a combination thereof, without departing from the scope hereof. Additionally, lens array 510 may include more or fewer lenses 511 than illustrated in FIG. 5, without departing from the scope hereof. Lens array 510 is molded, for example, by placing resin between a to molding tool and a bottom molding tool and hardening the resin, where one of the top and bottom molding tools include convex features for creating concave surfaces 512. The other one of top and bottom molding tools may include features for, for example, producing other desired shape properties of lenses 511. In another example, lens array 510 is formed by injection molding in a molding cavity including top and bottom molding tools, where one of the top and bottom molding tools include convex features for creating concave surface 512. The other one of top and bottom molding tools may include features for, for example, producing other desired shape properties of lenses 511.

In a step 420, lens array 510 is bonded to a substrate 520, such that concave surfaces 512 face substrate 520. This results in the formation of a suspended lens wafer 530 (FIG. 5), i.e., a wafer including a plurality of lenses suspended from a substrate. In an embodiment, the surface of substrate 520 facing lens array 510 is substantially planar and contacts only substantially planar surfaces of lens array 510. Lens array 510 is bonded to substrate 520 using one or more of, for example, direct bonding, adhesive bonding, annealing, and plasma activated bonding. Substrate 520 has non-zero optical transmission and optionally includes stop apertures 522 for at least a portion of the lenses of the lens array. For clarity of illustration, not all stop apertures 522 are labeled in FIG. 5. Stop apertures 522 may be an opaque coating applied to a surface of substrate 520. In an alternate example, substrate 520 is made of an opaque material with apertures, such that the material of substrate 520 forms a stop aperture. Although FIG. 5 illustrates stop apertures 522 as being located on the surface of substrate 520 that faces lens array 510, stop apertures 522 may be located on the surface of substrate 520 that faces away from lens array 510, internally in substrate 520, or throughout the thickness of substrate 520, without departing from the scope hereof. For example, at least a portion of substrate 520 may be made of an opaque material that spans the full thickness of substrate 520. In an embodiment, substrate 520 includes a material of non-zero optical transmission for passing through light to or from lenses 511. In another embodiment, substrate 520 includes a wavelength filter, such as a filter for blocking UV and/or infrared (IR) light. For example, substrate 520 may be made of a material that has reduced transmission in the UV and/or IR wavelength ranges. In yet another embodiment, substrate 520 includes apertures, not illustrated in FIG. 5, for passing through light to or from lenses 511.

In an optional step 430, suspended lens wafer 530 is diced to form one or more individual suspended lens systems 540. Each suspended lens system 540 includes a substrate 541, which is a portion of substrate 520, a lens 511, and, optionally, a stop aperture 522. Concave surface 512 faces substrate 541.

In an embodiment, method 400 includes a step 440, wherein a wavelength filter, such as a filter for blocking at least a portion of UV and/or IR light, is disposed on at least a portion of suspended lens wafer 530. The wavelength filter is, for example, a color glass filter, a blue glass filter, or a substrate with a dielectric coating. The wavelength filter is positioned on the side of lens array 510 that faces away from substrate 520. Optionally, step 440 includes a step 445 of disposing a spacer between the wavelength filter and suspended lens system 540. In an embodiment, method 400 performs step 430 subsequent to step 440, to form one or more individual suspended lens systems 550, and, optionally, one or more of suspended lens systems 540. Suspended lens system 550 includes a wavelength filter 551 disposed on suspended lens system 540. In one embodiment, corresponding to the embodiment of step 440 including step 445, suspended lens system 550 includes a spacer 552, located between suspended lens system 540 and wavelength filter 551, for providing a desired separation between suspended lens system 540 and wavelength filter 551. Wavelength filter 551 is, for example, a color glass filter, a blue glass filter, or a substrate with a dielectric coating. Spacer 552 may have shape different from that illustrated in FIG. 5, without departing from the scope hereof. In another embodiment, not illustrated in FIG. 5, one or both of lens 511 and wavelength filter 551 include features that provide a desired separation between suspended lens system 540 and wavelength filter 551, such that spacer 552 may be omitted.

In an embodiment, method 400 includes a step 450, wherein an image sensor 561 is disposed on at least some of individual suspended lenses 540 and/or suspended lens systems 550 to form one or more imaging systems 560 and/or one of more imaging systems 570, respectively. Optionally, step 450 includes a step 455 of disposing a spacer 562 between individual suspended lens systems 540, and/or suspended lens systems 550, and image sensor 561. Imaging system 560 includes suspended lens system 540 and image sensor 561. In one embodiment, corresponding to the embodiment of step 450 including step 455, imaging system 560 includes spacer 562, located between suspended lens system 540 and image sensor 561, for providing a desired separation between suspended lens system 540 and image sensor 561. Spacer 562 may have shape different from that illustrated in FIG. 5, without departing from the scope hereof. In another embodiment, not illustrated in FIG. 5, one or both of substrate 541 and image sensor 561 include features that provide a desired separation between suspended lens 540 and image sensor 561, such that spacer 562 may be omitted. Imaging system 570 includes suspended lens system 550 and image sensor 561. In one embodiment, corresponding to the embodiment of step 450 including step 455, imaging system 570 includes spacer 562, located between suspended lens system 550 and image sensor 561, for providing a desired separation between suspended lens system 550 and image sensor 561. Spacer 562 may have shape different from that illustrated in FIG. 5, without departing from the scope hereof. In another embodiment, not illustrated in FIG. 5, one or both of substrate 541 and image sensor 561 include features that provide a desired separation between suspended lens 550 and image sensor 561, such that spacer 562 may be omitted.

Although not illustrated in FIG. 5, suspended lens system 550, imaging system 560, and imaging system 570 may be configured with suspended lens system 540 having the opposite orientation, such that spacer 552 contacts substrate 541 and spacer 562 contacts lens 511, without departing from the scope hereof.

Figure 6:
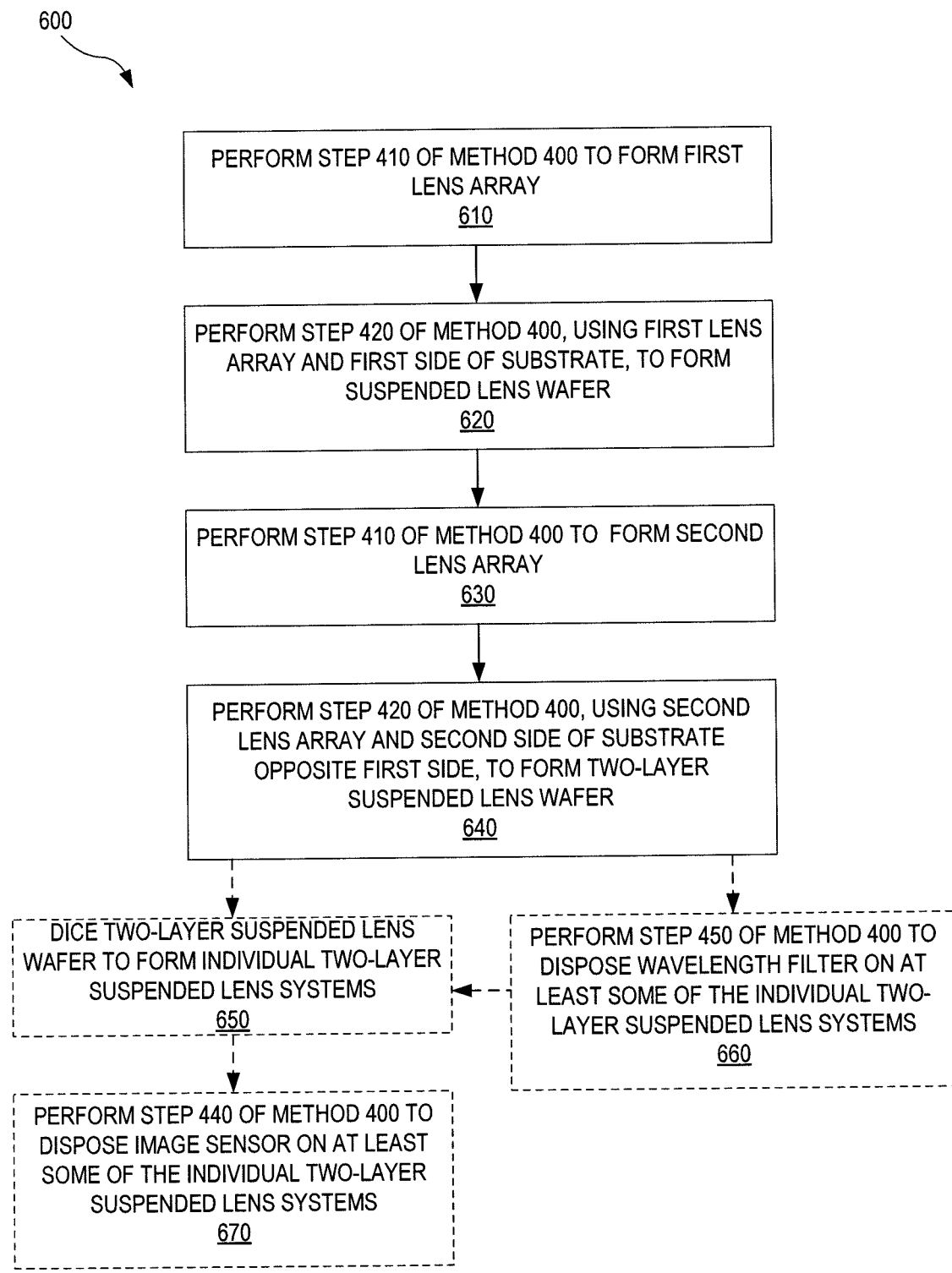
FIG. 6 is a flowchart illustrating a wafer-level method for manufacturing a suspended lens system that includes two suspended lenses, according to an embodiment.
Figure 7:
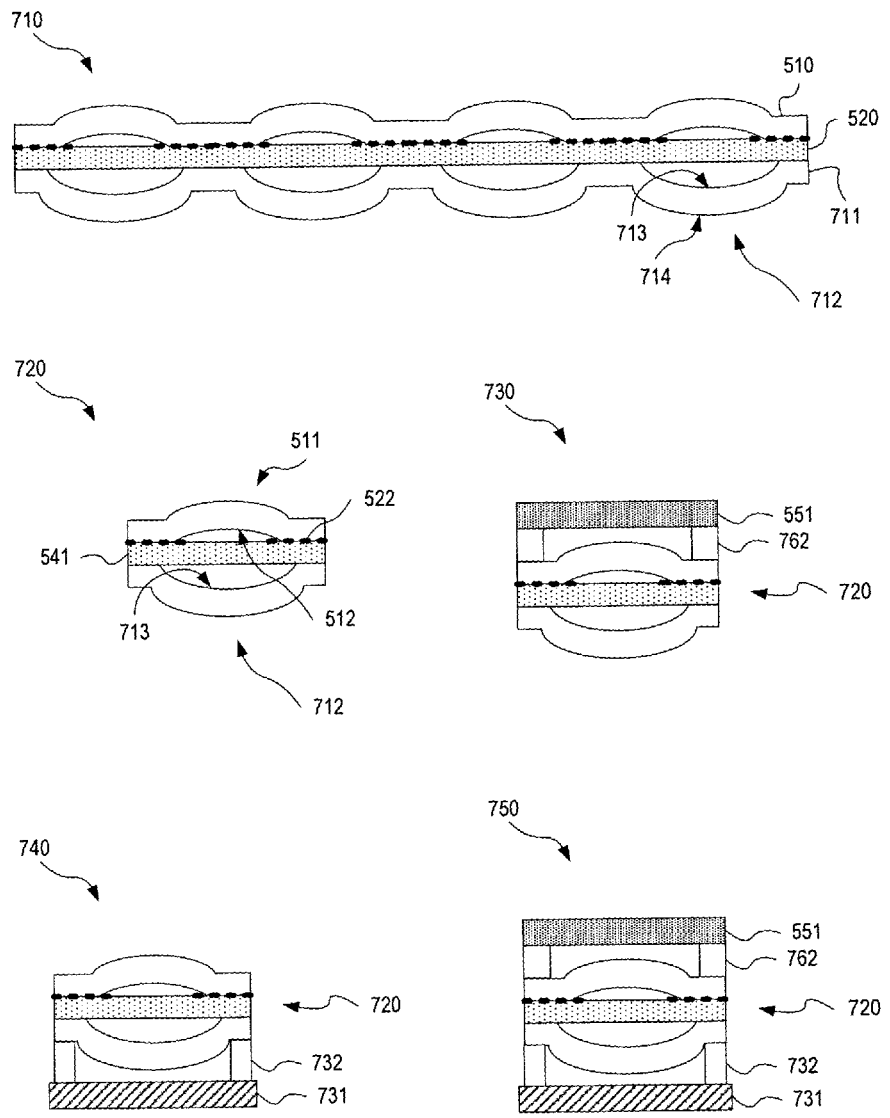
FIG. 7 illustrates a suspended lens wafer, two-layer suspended lens systems, and imaging systems including two-layer suspended lens system, all of which may be formed by or used in the method of FIG. 6, according to an embodiment.

FIG. 6 is a flowchart for one exemplary wafer-level method 600 for manufacturing a suspended lens system that includes two suspended lenses. FIG. 7 schematically illustrates, in cross-sectional side view, one exemplary two-layer suspended lens wafer 710, one exemplary two-layer suspended lens system 720, one exemplary two-layer suspended lens system 730 including two-layer suspended lens system 720 and a wavelength filter, one exemplary imaging system 740 including two-layer suspended lens system 720 and an image sensor, and one exemplary imaging system 750 including two-layer suspended lens system 740 and a wavelength filter. FIG. 7 is not drawn to scale. FIGS. 6 and 7 are best viewed together. Wafer-level method 600 may be used, for example, to manufacture two-layer suspended lens system 720, two-layer suspended lens system 730, imaging system 740, imaging system 750, camera 100 of FIG. 1, or imaging system 300 of FIG. 3. Two-layer suspended lens systems 720 and 730 are embodiments of imaging objective 110 (FIG. 1) as well as the imaging objective of imaging system 300 (FIG. 3) formed by suspended lenses 310 (FIG. 3) and 302 (FIG. 3) and substrate 315 (FIG. 3). Imaging systems 740 and 750 are embodiments of camera 100 (FIG. 1) as well as imaging system 300 (FIG. 3).

In a step 610, method 600 performs step 410 of method 400 (FIG. 4) to form lens array 510 of FIG. 5. In a step 620, suspended lens wafer 530 (FIG. 5) is formed, as discussed in connection with FIGS. 4 and 5. Suspended lens wafer 530 (FIG. 5) is formed by performing step 420 of method 400 (FIG. 4), using lens array 510 (FIG. 5) and a first side of substrate 520 (FIG. 5). In a step 630, method 600 performs step 410 of method 400 (FIG. 4) to form lens array 711. Lens array 711 is an embodiment of lens array 510 of FIG. 5. Lens array 711 includes at least one suspended lens 712 having a concave surface 713 and an opposing optical surface 714. Lens 712 is a single-piece lens. Lens 712 is an embodiment of suspended lens 112, and concave surface 713 and optical surface 714 are embodiments of concave surface 512 (FIG. 5) and optical surface 513 (FIG. 5), respectively. Optical surface 714 may be concave, convex, planar, or a combination thereof. In a step 640, method 600 performs step 420 of method 400 (FIG. 4) to form two-layer suspended lens wafer 710. Lens array 711 may include more or fewer lenses 712 than illustrated in FIG. 7, without departing from the scope hereof. For clarity of illustration, not all lenses 712, concave surfaces 713, and optical surfaces 714 are labeled in FIG. 7. Lens array 711 is bonded to a second side of substrate 520, which is opposite the first side of substrate 520 used in step 620, such that concave surfaces 713 face substrate 520. In an embodiment, substrate 520 is a substantially planar substrate and contacts only substantially planar portions of lens array 510 and 711. While FIG. 6 illustrates step 630 as being performed after step 620 and before step 640, step 630 may be performed at any point in time before step 640, without departing from the scope hereof.

In an optional step 650, two-layer suspended lens wafer 710 is diced to form one or more individual two-layer suspended lens systems 720. Two-layer suspended lens system 720 includes substrate 541, suspended lens 511, suspended lens 712, and, optionally, stop aperture 522. Concave surfaces 512 and 713 face substrate 541.

In an embodiment, method 600 includes a step 660, wherein method 600 performs step 440 of method 400 (FIG. 4) to dispose wavelength filter 551 on at least some of individual two-layer suspended lens systems 720. In an embodiment, method 600 performs step 650 subsequently to step 660, to form one or more individual two-layer suspended lens systems 730, and, optionally, one or more of two-layer suspended lens systems 720. Two-layer suspended lens system 730 includes wavelength filter 551 disposed on suspended lens system 720. In one embodiment, corresponding to step 660 being performed according to an embodiment of step 440 that includes step 445, two-layer suspended lens system 730 includes a spacer 762, located between suspended lens system 720 and wavelength filter 551, for providing a desired separation between two-layer suspended lens system 720 and wavelength filter 551. Spacer 762 may have shape different from that illustrated in FIG. 7, without departing from the scope hereof. In another embodiment, not illustrated in FIG. 7, one or both of lens 511 and wavelength filter 551 include features that provide a desired separation between two-layer suspended lens system 720 and wavelength filter 551, such that spacer 762 may be omitted.

In an embodiment, method 600 includes a step 670, wherein method 600 performs step 450 of method 400 (FIG. 4) to dispose an image sensor 731 on at least some of individual two-layer suspended lens systems 720 and/or two-layer suspended lens systems 730 to form one or more imaging systems 740 and/or one of more imaging systems 750, respectively. Optionally, step 670 is performed according to an embodiment of step 450 (FIG. 4) that includes step 455 (FIG. 4) of disposing a spacer 732 between individual two-layer suspended lens systems 720, and/or two-layer suspended lens systems 730, and image sensor 731. In an embodiment, lens array 711 includes substantially planar portions having defined thickness, to facilitate a desired distance from lens array 711 to image sensor 731. Imaging system 740 includes suspended lens system 720 and image sensor 731. In one embodiment, corresponding to the embodiment of step 670 including step 455 (FIG. 4), imaging system 740 includes a spacer 732, located between suspended lens system 720 and image sensor 731, for providing a desired separation between suspended lens system 720 and image sensor 731. Spacer 732 may have shape different from that illustrated in FIG. 7, without departing from the scope hereof. In another embodiment, not illustrated in FIG. 7, one or both of suspended lens 712 and image sensor 731 include features that provide a desired separation between two-layer suspended lens system 720 and image sensor 731, such that spacer 732 may be omitted. Imaging system 750 includes two-layer suspended lens system 730 and image sensor 731. In one embodiment, corresponding to the embodiment of step 670 including step 455, imaging system 750 includes spacer 732, located between two-layer suspended lens system 730 and image sensor 731, for providing a desired separation between two-layer suspended lens system 730 and image sensor 731. Spacer 732 may have shape different from that illustrated in FIG. 7, without departing from the scope hereof. In another embodiment, not illustrated in FIG. 7, one or both of suspended lens 712 and image sensor 731 include features that provide a desired separation between two-layer suspended lens system 730 and image sensor 731, such that spacer 732 may be omitted.

Figure 8:
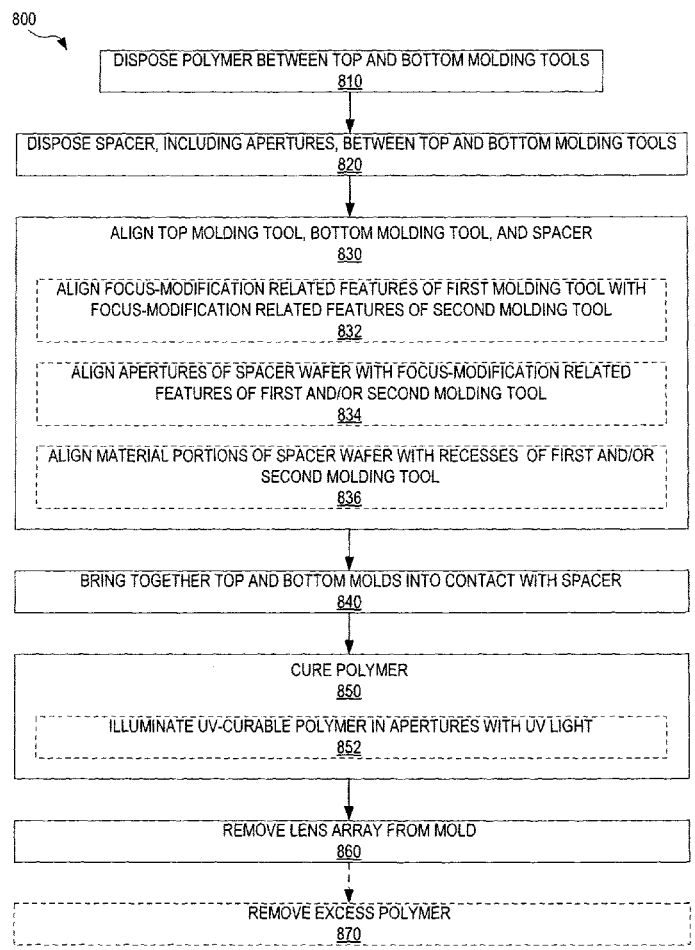
FIG. 8 illustrates one exemplary method for producing a lens array in a single molding step, according to an embodiment.
Figure 9:
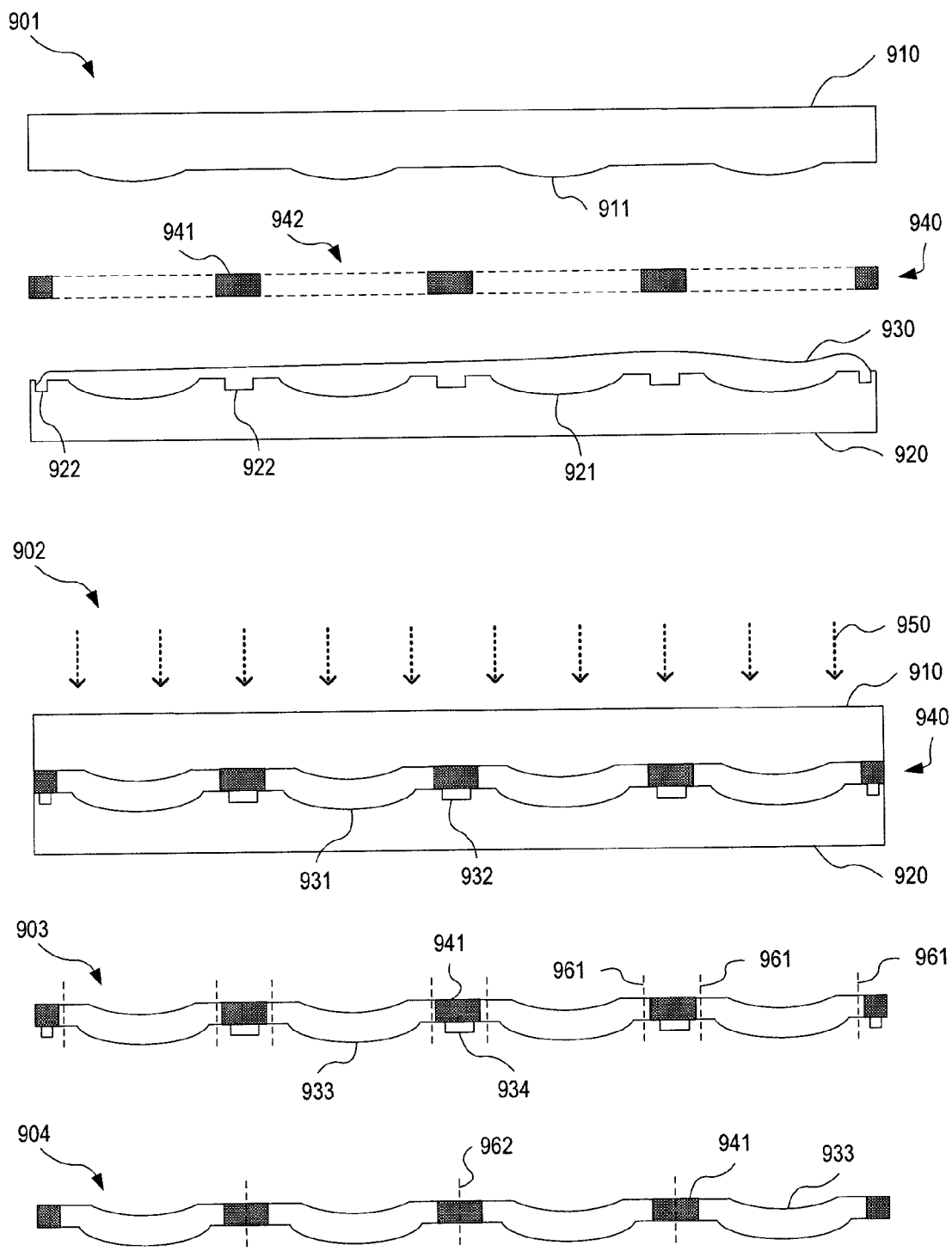
FIG. 9 illustrates steps of the method of FIG. 8, according to an embodiment.

FIG. 8 illustrates one exemplary method 800 for performing step 410 of method 400 (FIG. 4). Method 800 forms a lens array in a single molding step. FIG. 9 provides one exemplary illustration of steps of method 800. FIGS. 8 and 9 are best view together. In a step 810, illustrated in diagram 901 of FIG. 9, a polymer resin 930 is disposed between a top molding tool 910 and a bottom molding tool 920. Polymer resin 930 is, for example, a UV-curable polymer resin. Top molding tool 910 includes features 911 for shaping a concave lens surface, such as concave lens surface 512 (FIG. 5). Bottom molding tool 920 includes features 921, for shaping an optical surface opposing the concave lens surface, wherein this optical surface is an embodiment of optical surface 114 (FIG. 1). Bottom molding tool 920 further includes recesses 922 for accommodating excess amounts of polymer resin 930. For clarity of illustration, not all features 911, features 921, and recesses 922 are labeled in FIG. 9. Features 911 and 921 are related to focus-modifying properties of lenses of the lens array formed by method 800. Although not illustrated in FIG. 9, top molding tool 910 may have recesses for accommodating excess amounts of polymer resin 930, without departing from the scope hereof. Such recesses of top molding tool 910 may replace at least a portion of recesses 922 of bottom molding tool 920, or coexist with recesses 922 of bottom molding tool 920. Additionally, each of top molding tool 910 and bottom molding tool 920 may include more or fewer features 911, features 912, and/or recesses 922 than illustrated in FIG. 9, without departing from the scope hereof. Similarly, features 911, features 912, and/or recesses 922 may be shaped differently from what is illustrated in FIG. 9, without departing from the scope hereof.

In a step 820, also illustrated by diagram 901 of FIG. 9, a spacer 940 is disposed between top molding tool 910 and bottom molding tool 920. Spacer 940 includes apertures 942 and material portions 941 separating apertures 942. For clarity of illustration, not all apertures 942 and material portion 941 are labeled in FIG. 9. In a step 830, top molding tool 910, bottom molding tool 920, and spacer 940 are aligned with respect to each other, such that an individual feature 911 is aligned with respect to a corresponding aperture 942 and a corresponding feature 921. One or both of top molding tool 910 and bottom molding tool 920 may be of a non-opaque material, which provides visual or optical axis through at least one of top molding tool 910 and bottom molding tool 920 for aligning top molding tool 910, bottom molding tool 920, and spacer 940. In certain embodiments, feature 911, feature 921, and aperture 942 are centered on a common axis that is substantially orthogonal to spacer 940. In an embodiment, step 830 includes a step 832, wherein features 911 of top molding tool 910 are aligned with corresponding features 921 of bottom molding tool 920. In an embodiment, step 830 includes one or both of steps 834 and 834. In step 834, apertures 942 of spacer 940 are aligned with corresponding features 911 and/or features 921. In step 836, material portions 941 of spacer 940 are aligned with recesses 922 of bottom molding tool 920, such that, when bringing together spacer 940 and bottom mold 920, recesses 922 face only material portions 941 of spacer 940. In embodiments of top molding tool 910 including recesses (not illustrated in FIG. 9), step 836 includes aligning such recesses with material portions 941, as discussed above for recesses 922.

In a step 840, top molding tool 910 and bottom molding tool 920 are brought into contact with spacer 940. In one embodiment, top molding tool 910 and bottom molding tool 920 are brought into contact with spacer 940 at the same time. In another embodiment, corresponding to an embodiment of top molding tool 910 having no recesses, spacer 940 is first brought into contact with top molding tool 910, and next brought into contact with bottom molding tool 920.

In a step 850, illustrated by diagram 902 of FIG. 9, polymer resin 930 is cured. In one embodiment, polymer resin 930 is a thermoset polymer resin, which is cured by heating polymer 930. In another embodiment, polymer resin 930 is a UV-curable polymer resin, at least one of top molding tool 910 and bottom molding tool 920 is capable of transmitting UV light, and step 850 includes a step 852 for curing polymer resin 930, by UV-curing at least a portion of polymer resin 930. In step 852, a polymer resin portions 931 of polymer resin 930, which are located in apertures 942 of spacer 940, are exposed to UV light 950. For example, as illustrated in FIG. 9, top molding tool 910 is at least partially transmissive to UV light 950. UV light 950 propagates through top molding tool 910 to polymer resin portions 931. On the other hand, when using an embodiment of material portion 941 that is opaque to or has reduced transmission of UV light, polymer resin portions 932 of polymer resin 930, which are located in recesses 932, are not exposed to UV light 950. Thus, step 852 may be performed such that only polymer resin portions 931 are cured. In another embodiment, UV light 950 and/or material properties of spacer 940 are configured such that step 852 cures polymer resin portions 931 and polymer resin portions 932. Step 850 is the final step in the process to form a lens array 903. Lens array 903 includes lenses 933, material portions 941, and excess polymer 934. Lens 933 is an embodiment of suspended lens 112 (FIG. 1), and is therefore a single-piece lens. Excess polymer 934 may be a cured, uncured, or partially cured portion of polymer resin 930. Lens array 903 is an embodiment of lens arrays 510 (FIG. 5) and 711 (FIG. 7), and lenses 933 are embodiments of lenses 511 (FIG. 5) and 712 (FIG. 7). For clarity of illustration, not all polymer resin portions 931 and 932, lenses 933, and excess polymer 934, are labeled in FIG. 9.

In a step 860, lens array 903 is removed from top molding tool 910 and bottom molding tool 920. In an optional step 870, excess polymer 934 is removed from lens array 903 to form lens array 904. For example, excess polymer 934 is removed from lens array 903 using a water and/or solvent capable of dissolving polymer material that is uncured or not fully cured. Lens array 904 is an embodiment of lens array 510 (FIG. 5) and lens array 711 (FIG. 7).

While FIGS. 5 and 7 do not illustrate lens arrays 510 (FIGS. 5 and 7) and 711 (FIG. 7) as having material spacer portions, such as material portions 941 (FIG. 9), one or both of lens arrays 510 and 711 may include material spacer portions, as illustrated for lens arrays 903 and 904, without departing from the scope hereof. Consequently, suspended lenses 511 of suspended lens system 540 (FIG. 5), suspended lens system 550 (FIG. 5), imaging system 560 (FIG. 5), and imaging system 570 (FIG. 5), and suspended lenses 511 and/or 712 of suspended lens system 720 (FIG. 7), suspended lens system 730 (FIG. 7), imaging system 740 (FIG. 7), and imaging system 750 (FIG. 7) may include material spacer portions, such as material portions 941 (FIG. 9). Accordingly, in methods 400 (FIG. 4) and 600 (FIG. 6), step 410 and steps 610 and 630 may be performed according to method 800 (FIG. 8).

Figure 10:
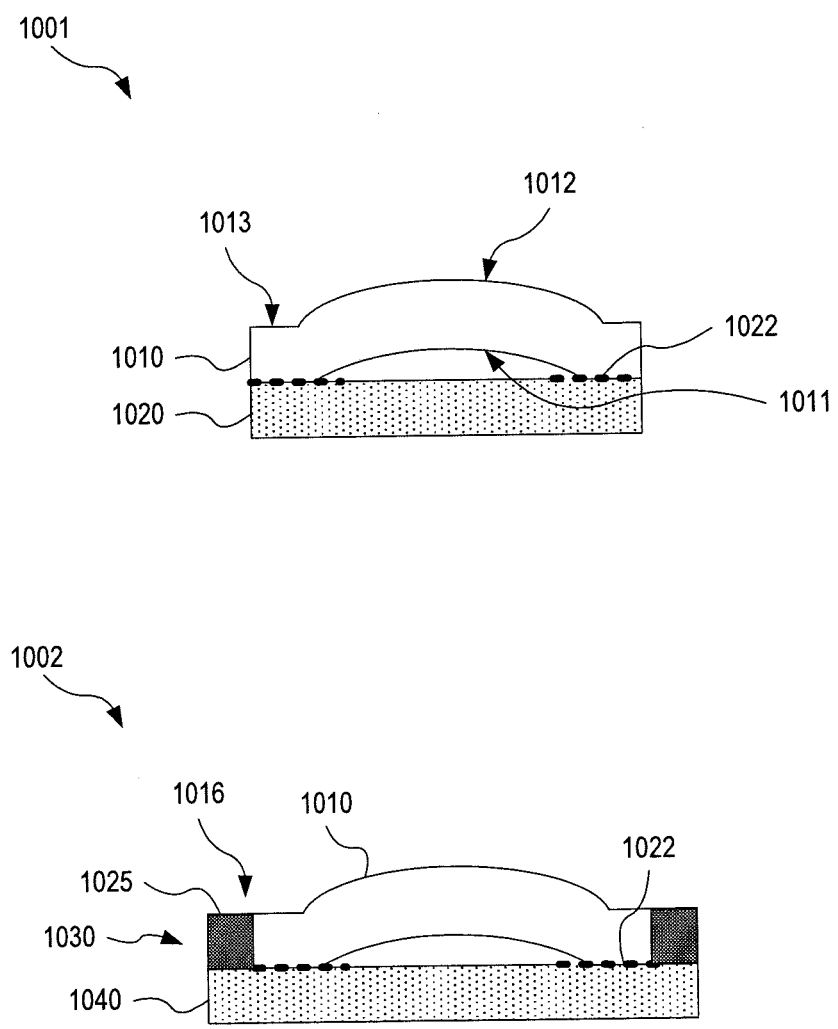
FIG. 10 illustrates suspended lens systems, wherein the suspended lenses include or do not include a material spacer portion, according to an embodiment.

FIG. 10 illustrates exemplary suspended lens systems 1001 and 1002. Suspended lens systems 1001 and 1002 are embodiments of suspended lens system 540 (FIG. 5).

Suspended lens system 1001 includes a suspended lens 1010 suspended from a substrate 1020. Suspended lens 1010 is an embodiment of suspended lens 112 (FIG. 1), lens 511 (FIG. 5), and lens 933 (FIG. 9). Thus, suspended lens 1010 is a single-piece lens. Substrate 1020 is an embodiment of substrate 541 (FIG. 5). Optionally, substrate 1020 includes a stop aperture 1022, which is an embodiment of stop aperture 522 (FIG. 5). In an embodiment, the surface of substrate 1020 facing suspended lens 1010 is substantially planar and contacts only substantially planar portions of suspended lens 1010. Suspended lens 1010 includes a concave surface 1011, an optical surface 1012, and a substantially planar surface 1013. Planar surface 1013 is suitable for disposing thereon a spacer element, such as spacer 552 or 562 of FIG. 5. Concave surface 1011 is an embodiment of concave surface 512 (FIG. 5), and optical surface 1012 is an embodiment of optical surface 514 (FIG. 5). Optical surface 1012 may be concave, convex, planar, or a combination thereof. Suspended lens system 1001 may be formed, for example by performing steps 410, 420, and 430 of method 400 (FIG. 4), with step 410 performed according to method 800 (FIG. 8) and with step 430 using dicing lines 961 (FIG. 9). In this example, method 800 may be performed without including optional step 870.

Suspended lens system 1002 includes a suspended lens 1030 suspended from a substrate 1040. Suspended lens 1030 is an embodiment of suspended lens 112 (FIG. 1), lens 511 (FIG. 5), and lens 933 (FIG. 9). Thus, suspended lens 1030 is a single-piece lens. Substrate 1040 is an embodiment of substrate 541 (FIG. 5). Optionally, substrate 1040 includes stop aperture 1022. In an embodiment, the surface of substrate 1040 facing suspended lens 1030 is substantially planar and contacts only substantially planar portions of suspended lens 1030. Suspended lens 1030 includes suspended lens 1010 and material spacer portions 1025. Material spacer portion 1025 is an embodiment of material portion 941 (FIG. 9). Material spacer portion 1025 forms, optionally together with a portion of suspended lens 1010, a substantially planar surface 1016. Planar surface 1016 is suitable for disposing thereon a spacer element, such as spacer 552 or 562 of FIG. 5. Suspended lens system 1002 may be formed, for example by performing steps 410, 420, and 430 of method 400 (FIG. 4), with step 410 performed according to method 800 (FIG. 8) and with step 430 using dicing lines 962 (FIG. 9). In this example, method 800 is performed with optional step 870 included therein.

Figure 11:
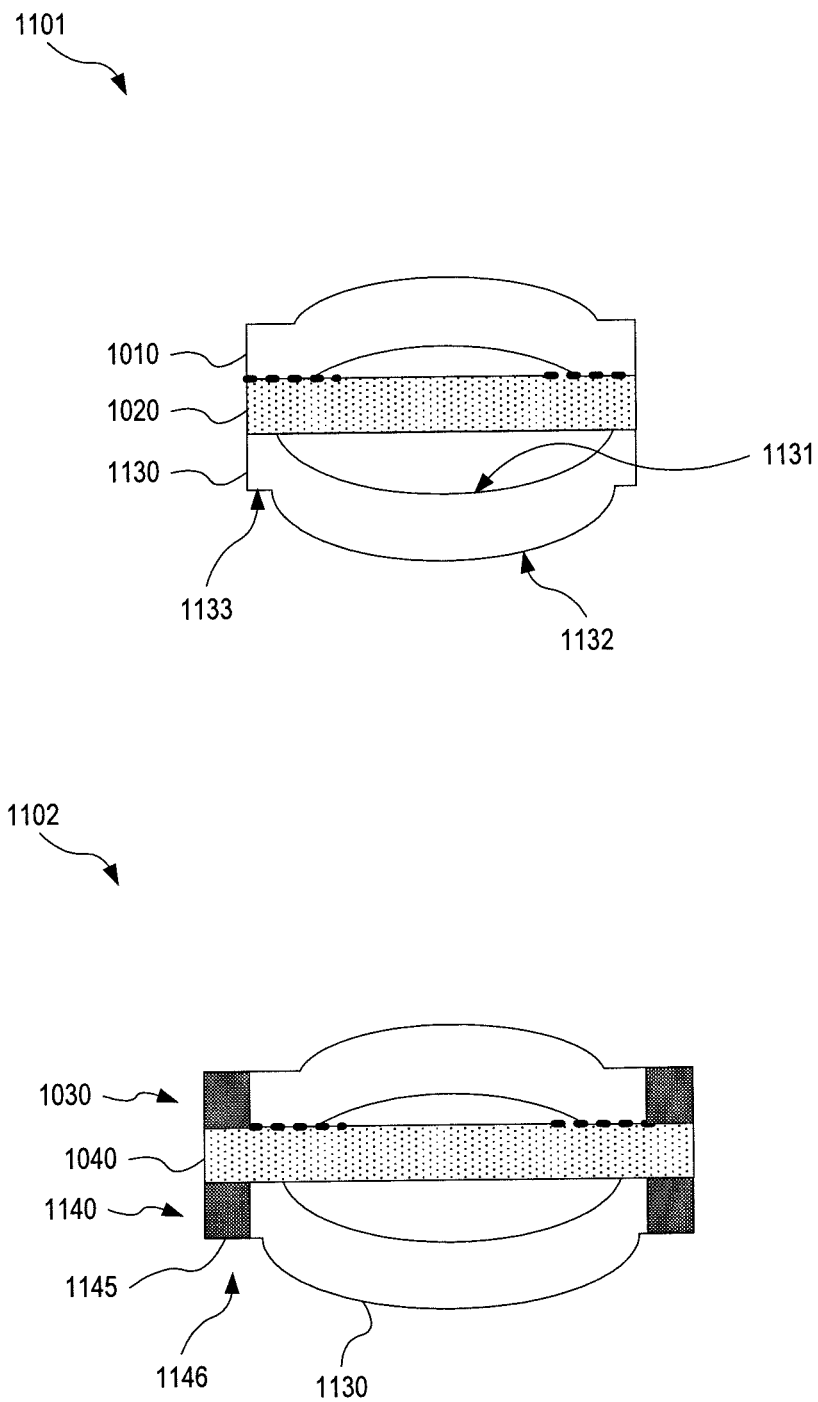
FIG. 11 illustrates two-layer suspended lens systems, wherein the suspended lenses include or do not include a material spacer portion, according to an embodiment.

FIG. 11 illustrates exemplary two-layer suspended lens systems 1101 and 1102. Two-layer suspended lens systems 1101 and 1102 are embodiments of suspended lens system 720 (FIG. 7).

Two-layer suspended lens system 1101 includes suspended lens 1010 (FIG. 10) suspended from substrate 1020 (FIG. 10), and a suspended lens 1130 suspended from substrate 1020. Suspended lenses 1010 and 1130 are suspended from opposite sides of substrate 1020. Suspended lens 1130 is an embodiment of suspended lens 320 (FIG. 3) and 712 (FIG. 7), and is therefore a single-piece lens. In an embodiment, substrate 1020 is substantially planar and contacts only substantially planar portions of suspended lenses 1010 and 1130. Suspended lens 1130 includes a concave surface 1131, an optical surface 1132, and a substantially planar surface 1133. Concave surface 1131 and optical surface 1132 are embodiments of concave surface 512 (FIG. 5) and optical surface 513 (FIG. 5), respectively. Planar surface 1133 is suitable for disposing thereon a spacer element, such as spacer 552 or 562 of FIG. 5. Concave surface 1131 is an embodiment of concave surface 713 (FIG. 7). Optical surface 1132 may be concave, convex, planar, or a combination thereof. Two-layer suspended lens system 1101 may be formed, for example by performing steps 610, 620, 630, 640, and 650 of method 600 (FIG. 6), with step 610 performed according to method 800 (FIG. 8) and with step 650 using dicing lines 961 (FIG. 9). In this example, method 800 may be performed without including optional step 870.

Two-layer suspended lens system 1102 includes suspended lens 1030 (FIG. 10) suspended from substrate 1040 (FIG. 10), and a suspended lens 1140 suspended from substrate 1040 (FIG. 10). Suspended lenses 1030 and 1140 are suspended from opposite sides of substrate 1040. Suspended lens 1140 is an embodiment of suspended lens 320 (FIG. 3) and suspended lens 712 (FIG. 7), and is therefore a single-piece lens. In an embodiment, substrate 1040 is substantially planar and contacts only substantially planar portions of suspended lenses 1030 and 1140. Suspended lens 1140 includes suspended lens 1130 and a material spacer portion 1145. Material spacer portion 1145 is an embodiment of material portion 941 (FIG. 9). Material spacer portion 1145 forms, optionally together with a portion of suspended lens 1130, a substantially planar surface 1146. Planar surface 1146 is suitable for disposing thereon a spacer element, such as spacer 552 or 562 of FIG. 5. Two-layer suspended lens system 1101 may be formed, for example by performing steps 610, 620, 630, 640, and 650 of method 600 (FIG. 6), with step 610 performed according to method 800 (FIG. 8) and with step 650 using dicing lines 962 (FIG. 9). In this example, method 800 is performed with optional step 870 included therein. Two-layer suspended lens system 1102 may be configured without material spacer portion 1025 (FIG. 10), or without material spacer portion 1145, without departing from the scope hereof.

Figure 12:
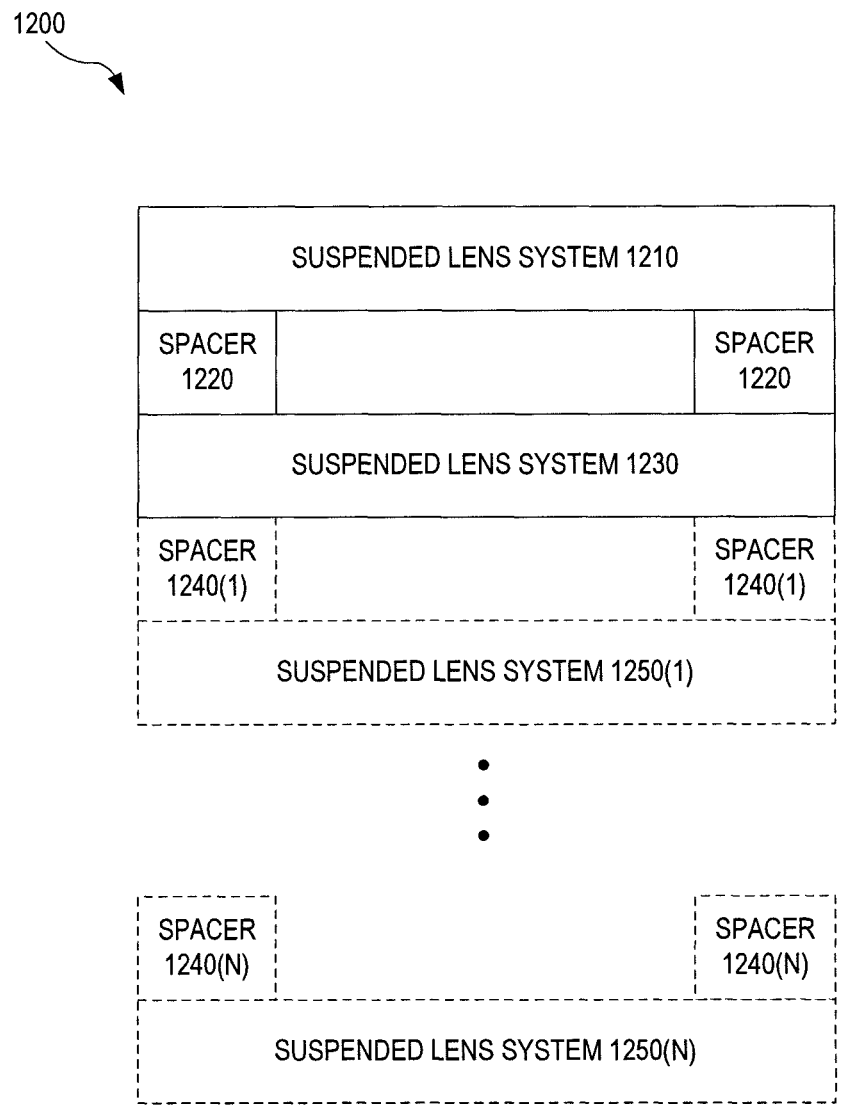
FIG. 12 illustrates one exemplary stacked lens system including a stacked plurality of suspended lens systems, according to an embodiment.

FIG. 12 illustrates one exemplary stacked lens system 1200 including a stacked plurality of suspended lens systems. Stacked lens system 1200 includes at least two suspended lens systems 1210 and 1230, separated by a spacer 1220. Optionally, stacked lens system 1200 further includes one or more additional suspended lens system 1250 and one or more respective additional spacers 1240 for stacking the one or more additional suspended lens systems 1250 onto suspended lens system 1230 and, optionally, each other. Each of suspended lens systems 1210, 1230, and 1250 include at least one suspended lens, such as suspended lens 112, suspended from a substrate 115 (FIG. 1). In certain embodiments, suspended lens systems 1210, 1230, and 1250 include embodiments of suspended lens system 540 (FIG. 5), suspended lens system 550 (FIG. 5), imaging system 560 (FIG. 5), imaging system 570 (FIG. 5), suspended lens system 720 (FIG. 7), suspended lens system 730 (FIG. 7), imaging system 740 (FIG. 7), imaging system 750 (FIG. 7), suspended lens system 1001 (FIG. 10), suspended lens system 1002 (FIG. 10), suspended lens system 1101 (FIG. 11), and suspended lens system 1102 (FIG. 11). Additionally, stacked lens system 1200 may include other lenses or lens systems that do not include suspended lenses, without departing from the scope hereof.

Combinations of Features

Features described above as well as those claimed below may be combined in various ways without departing from the scope hereof. For example, it will be appreciated that aspects of one suspended lens system or wafer-level method for manufacturing the same described herein may incorporate or swap features of another suspended lens system or wafer-level method for manufacturing the same described herein. The following examples illustrate possible, non-limiting combinations of embodiments described above. It should be clear that many other changes and modifications may be made to the methods and device herein without departing from the spirit and scope of this invention:

(A) A suspended lens system for imaging a scene may include (a) a first single-piece lens for receiving light from the scene, wherein the first single-piece lens includes a first concave surface, and (b) a substrate including a first side, facing the first concave surface, for holding the first single-piece lens, wherein the substrate has non-zero optical transmission and contacts only portions of the first single-piece lens away from the first concave surface.

(B) In the suspended lens system denoted as (A), the substrate may be substantially planar and contact only substantially planar portions of the first single-piece lens.

(C) The suspended lens systems denoted as (A) and (B) may further include an image sensor for generating an electronic image from at least a portion of light passing through the first single-piece lens from the scene.

(D) In the suspended lens system denoted as (C), the first single-piece lens may have extent, in dimensions parallel with a light-receiving surface of the image sensor, that is no greater than respective extent of the image sensor.

(E) In the suspended lens systems denoted as (A) through (D), the substrate may include a stop aperture.

(F) In the suspended lens systems denoted as (A) through (E), the substrate may include a filter for wavelength filtering at least a portion of light passing through the first single-piece lens from the scene.

(G) In the suspended lens systems denoted as (A) through (F), the first single-piece lens may be a meniscus lens.

(H) The suspended lens systems denoted as (A) through (G) may further include a second single-piece lens for receiving at least a portion of light passing through the first single-piece lens from the scene, wherein (a) the second single-piece lens includes a second concave surface facing the first concave surface, (b) the second single-piece lens is held by a second side of the substrate opposite of the first side, and (c) the substrate contacting only portions of the second single-piece lens away from the second concave surface.

(I) In the suspended lens system denoted as (H), the second single-piece lens may be a meniscus lens.

(J) The suspended lens systems denoted as (H) and (I) may further include a spacer disposed on the second single-piece lens and contacting only a substantially planar portion thereof; and an image sensor, suspended from the spacer, for generating an electronic image of light propagating thereto from the second single-piece lens.

(K) In the suspended lens system denoted as (J), the first and second single-piece lenses may have extent, in dimensions parallel with a light-receiving surface of the image sensor, that is no greater than respective extent of the image sensor.

(L) The suspended lens systems denoted as (A) through (K) may further include a spacer disposed on the first single-piece lens and contacting only substantially planar portions thereof; and a wavelength filter, suspended from the spacer, for filtering light propagating from the scene towards the first single-piece lens.

(M) A wafer-level method for manufacturing a suspended lens system may include molding a first lens array, wherein each lens of the first lens array includes a concave surface, and bonding the first lens array to a first surface of a substrate, having non-zero optical transmission, such that the concave surfaces face the substrate, to form a suspended lens wafer.

(N) The wafer-level method denoted as (M) may further include dicing the suspended lens wafer to form individual suspended lens systems.

(O) The wafer-level method denoted as (N) may further include disposing an image sensor on each of at least a portion of the individual suspended lens systems.

(P) In the wafer-level methods denoted as (M) through (O), the step of molding may include disposing a polymer between a first molding tool and a second molding tool.

(Q) In the wafer-level method denoted as (P), the step of molding may further include disposing a spacer wafer between the first and second molding tools, wherein the spacer wafer includes apertures.

(R) In the wafer-level method denoted as (Q), the step of molding may further include bringing the first and second molding tools into contact with the spacer wafer, wherein one of the first and second molding tools includes convex surface portions, such that the convex surface portions are aligned with the apertures.

(S) In the wafer-level method denoted as (R), the step of molding may further include curing at least a portion of the polymer to form the first lens array, wherein the portion of the polymer is located in one or more of the apertures.

(T) In the wafer-level methods denoted as (P) through (S), one of the first and second molding tools may include recesses for receiving excess polymer.

(U) The wafer-level method denoted as (T) may include aligning material portions of the spacer wafer with the recesses.

(V) The wafer-level method denoted as (U) may include removing excess polymer from the lens array after the step of curing.

(W) In the wafer-level methods denoted as (P) through (V), the polymer may be an ultra-violet-light curable polymer.

(X) In the wafer-level method denoted as (Q) through (W), the polymer may be an ultra-violet-light curable polymer, and the step of curing may include illuminating, with ultra-violet light, the polymer from a side of the spacer wafer opposite the recesses.

(Y) In the wafer-level methods denoted as (M) through (X), each lens of the first lens array may be a meniscus lens.

(Z) The wafer-level methods denoted as (M) through (Y) may further include molding a second lens array, wherein each lens of the second lens array includes a concave surface; and bonding the second lens array to a second surface of the substrate facing away from the first surface, such that the concave surfaces face the substrate and each lens of the second lens array is aligned with a respective lens of the first lens array, to form a two-layer suspended lens system.

(AA) In the wafer-level method denoted as (Z), the second lens array may include substantially planar portions that have defined thickness in a dimension orthogonal to the substrate.

(AB) The wafer-level methods denoted as (Z) and (AA) may further include dicing the lens wafer to form individual two-layer suspended lens systems.

(AC) The wafer-level method denotes as (AB) may further include disposing an image sensor on each of at least a portion of the individual two-layer suspended lens systems.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present system and method, which, as a matter of language, might be said to fall therebetween.

What is claimed is:

1. A suspended lens system for imaging a scene, comprising:
   a first single-piece lens for receiving light from the scene, the first single-piece lens including a first concave surface; and
   a substrate including a first side, facing the first concave surface, for holding the first single-piece lens, the substrate having non-zero optical transmission and contacting only portions of the first single-piece lens away from the first concave surface.

2. The suspended lens system of claim 1, the substrate being substantially planar and contacting only substantially planar portions of the first single-piece lens.

3. The suspended lens system of claim 1, further comprising an image sensor for generating an electronic image from at least a portion of light passing through the first single-piece lens from the scene, the first single-piece lens having extent, in dimensions parallel with a light-receiving surface of the image sensor, that is no greater than respective extent of the image sensor.

4. The suspended lens system of claim 1, the substrate comprising a stop aperture.

5. The suspended lens system of claim 1, the substrate comprising a filter for wavelength filtering at least a portion of light passing through the first single-piece lens from the scene.

6. The suspended lens system of claim 1, the first single-piece lens being a meniscus lens.

7. The suspended lens system of claim 6, further comprising a second single-piece lens for receiving at least a portion of light passing through the first single-piece lens from the scene, the second single-piece lens including a second concave surface facing the first concave surface, the second single-piece lens being held by a second side of the substrate opposite of the first side, the substrate contacting only portions of the second single-piece lens away from the second concave surface.

8. The suspended lens system of claim 7, the second single-piece lens being a meniscus lens.

9. The suspended lens system of claim 7, further comprising:
   a spacer disposed on the second single-piece lens and contacting only a substantially planar portion thereof; and
   an image sensor, suspended from the spacer, for generating an electronic image of light propagating thereto from the second single-piece lens.

10. The suspended lens system of claim 9, the first and second single-piece lenses having extent, in dimensions parallel with a light-receiving surface of the image sensor, that is no greater than respective extent of the image sensor.

11. The suspended lens system of claim 1, further comprising:
    a spacer disposed on the first single-piece lens and contacting only substantially planar portions thereof; and
    a wavelength filter, suspended from the spacer, for filtering light propagating from the scene towards the first single-piece lens.

12. A wafer-level method for manufacturing a suspended lens system, comprising:
    molding a first lens array, each lens of the first lens array including a concave surface; and
    bonding the first lens array to a first surface of a substrate, having non-zero optical transmission, such that the concave surfaces face the substrate, to form a suspended lens wafer.

13. The wafer-level method of claim 12, further comprising:
    dicing the suspended lens wafer to form individual suspended lens systems; and
    disposing an image sensor on each of at least a portion of the individual suspended lens systems.

14. The wafer-level method of claim 12, the step of molding comprising:
    disposing a polymer between a first molding tool and a second molding tool;
    disposing a spacer wafer between the first and second molding tools, the spacer wafer including apertures;
    bringing the first and second molding tools into contact with the spacer wafer, one of the first and second molding tools including convex surface portions, such that the convex surface portions are aligned with the apertures; and
    curing at least a portion of the polymer to form the first lens array, the portion of the polymer being located in one or more of the apertures.

15. The wafer-level method of claim 14, one of the first and second molding tools including recesses for receiving excess polymer, the method further comprising:
    aligning material portions of the spacer wafer with the recesses; and
    removing excess polymer from the lens array after the step of curing.

16. The wafer-level method of claim 15, the polymer being an ultra-violet-light curable polymer, the step of curing comprising illuminating, with ultra-violet light, the polymer from a side of the spacer wafer opposite the recesses.

17. The wafer-level method of claim 12, each lens of the first lens array being a meniscus lens.

18. The wafer-level method of claim 12, further comprising:
    molding a second lens array, each lens of the second lens array including a concave surface; and
    bonding the second lens array to a second surface of the substrate facing away from the first surface, such that the concave surfaces face the substrate and each lens of the second lens array is aligned with a respective lens of the first lens array, to form a two-layer suspended lens system.

19. The wafer-level method of claim 18, the second lens array including substantially planar portions having defined thickness in a dimension orthogonal to the substrate.

20. The wafer-level method of claim 18, further comprising:
    dicing the suspended lens wafer to form individual two-layer suspended lens systems; and
    disposing an image sensor on each of at least a portion of the individual two-layer suspended lens systems.

21. The wafer-level method of claim 12, in the step of molding and in the step of bonding, the first lens array being a contiguous lens array.

22. The wafer-level method of claim 16, material portions of the spacer wafer being opaque to ultra-violet light, the step of curing comprising:
    directing ultra-violet light toward the spacer wafer; and
    blocking portion of the ultra-violet light incident on the material portions to avoid exposure of the excess polymer to the ultra-violet light.

23. The suspended lens system of claim 1, the substrate being configured to at least partly transmit the light propagating from the scene through the first single-piece lens.

* * * * *